United States Patent [19]

Matsutani et al.

[11] Patent Number: 4,565,671
[45] Date of Patent: Jan. 21, 1986

[54] SINGLE CRYSTAL MANUFACTURING APPARATUS

[75] Inventors: Kinya Matsutani, Yokohama; Toshikazu Yokota, Tokyo, both of Japan

[73] Assignee: Kabushiki Kaisha Toshiba, Kawasaki, Japan

[21] Appl. No.: 636,682

[22] Filed: Aug. 1, 1984

[30] Foreign Application Priority Data

Aug. 5, 1983 [JP] Japan .................................. 58-143539
Aug. 5, 1983 [JP] Japan .................................. 58-143540

[51] Int. Cl.$^4$ ............................................. C30B 15/14
[52] U.S. Cl. ........................................................ 422/249
[58] Field of Search .................... 156/617 SP; 422/249

[56] References Cited

U.S. PATENT DOCUMENTS 3,607,139  9/1971  Hanks ............................ 156/617 SP

FOREIGN PATENT DOCUMENTS 5645889   9/1979  Japan .
56-104791 1/1980  Japan .
57-149894 3/1981  Japan .
1347108   2/1974  United Kingdom .
2109267   6/1983  United Kingdom .

Primary Examiner—Hiram H. Bernstein
Attorney, Agent, or Firm—Oblon, Fisher, Spivak, McClelland & Maier

[57] ABSTRACT

A single crystal manufacturing apparatus has a pulling mechanism and a magnetic field generating unit. The pulling mechanism grows a single crystal by inserting a seed crystal into a melting liquid of a single crystal raw material and pulling the seed crystal from the melting liquid at a predetermined speed. The generating unit has a pair of superconductive magnets for applying a magnetic field to the melting liquid. The magnetic field applied from the magnets suppresses a thermal convection in the vicinity of the surface of the melting liquid and allows the thermal convection in the region of the melting liquid below the surface thereof.

11 Claims, 17 Drawing Figures

B1 B2
INTENSITY OF MAGNETIC FIELD

NG1 NG2 NGC
GRASHOF NUMBER

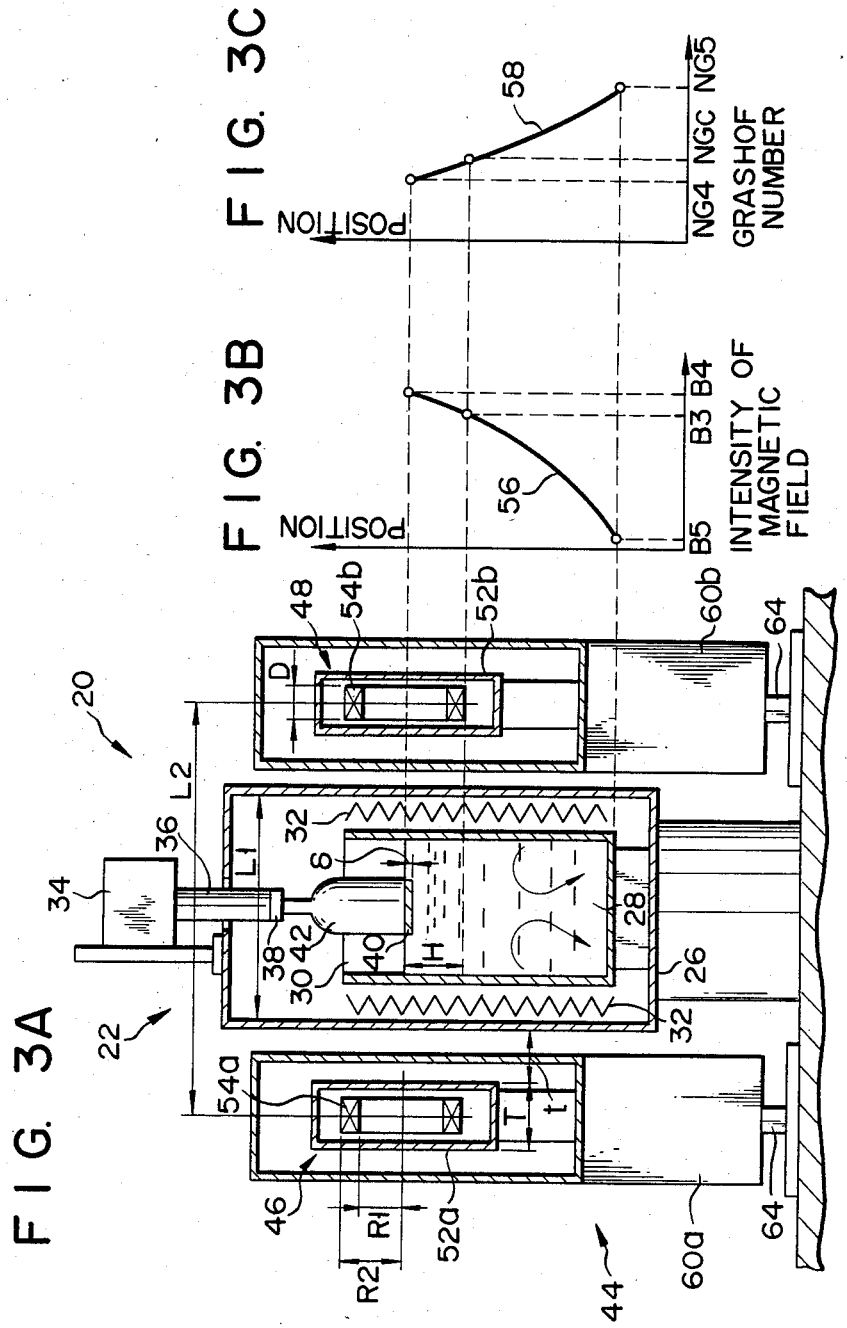

SINGLE CRYSTAL MANUFACTURING APPARATUS

BACKGROUND OF THE INVENTION

The present invention relates to a single crystal manufacturing apparatus for manufacturing, for example, a silicon single crystal used as a semiconductor material and, more particularly, to a single crystal manufacturing apparatus having a magnet unit for applying a magnetic field to a single crystal raw material melting liquid.

FIG. 1 shows an example of the structure of a conventional single crystal pulling apparatus by means of the Czochralski method (a CZ method). A crucible 2 in which a single crystal raw material melting liquid (hereafter abbreviated as "a melting liquid") 1 is filled, is heated by a heater 3, and the single crystal raw material is always maintained in a melted state. When a seed crystal 4 is inserted into the melting liquid and the crystal 4 is then pulled by a pull driving mechanism 5 at a predetermined speed, a crystal is grown on a solid-liquid surface boundary layer 6 disposed in a liquid surface range of the melting liquid 4, and a single crystal 7 is produced. In this case, a fluid motion of the melting liquid 1 induced due to the heating of the heater 3, i.e., a thermal convection 8 occurs.

The reason that the thermal convection 8 occurs will be described as follows: The thermal convection 8 occurs in general when a balance between a buoyancy of a fluid caused by a thermal expansion and a viscous force of the fluid is broken down. The no dimensional quantity for representing the balance relationship between the buoyancy and the viscous force is represented by the following Grashof number $N_{Gr}$:

$$N_{Gr} = g \cdot \alpha \cdot \Delta T \cdot R_3 / \nu^3$$

where
- g: gravity acceleration
- α: thermal expansion coefficient of melting liquid
- T: radial temperature difference of crucible
- R: radius of crucible
- ν: dynamic viscous coefficient of melting liquid When the Grashof number $N_{Gr}$ generally exceeds the critical value determined by the geometrical size of the melting liquid 1 and thermal environmental conditions, a thermal convection 8 occurs in the melting liquid 8. Normally, the thermal convection 8 of the melting liquid 1 becomes a turbulent state when $N_{Gr} > 10^5$ and becomes a disturbing state when $N_{Gr} > 10^9$. The Grashof number becomes $N_{Gr} > 10^9$ under the melting liquid conditions when pulling the single crystal of 3 to 4 inches in diameter carried out at present (according to the equation of the $N_{Gr}$). The melting liquid 1 becomes a disturbing state, and the liquid surface of the melting liquid 1, i.e., the solid-liquid surface boundary layer 6, becomes wavy.

When the thermal convection 8 of the above-described disturbing state occurs, the temperature variations in the melting liquid 1, and particularly in the solid-liquid surface boundary layer 6, becomes vigorous, the positional and timing variations of the thickness of the solid-liquid surface boundary layer 6 become vigorous, and the microminiature remelting of the crystal during the growth becomes remarkable. Thus, dislocation-loop, laminated-layer defects occur in the grown single crystal 7. Further, the defective part irregularly occurs with respect to the pulling direction of the single crystal due to the irregular variations in the solid-liquid surface boundary layer 6.

Further, impurities 9 melted in the melting liquid 1 are conveyed to the thermal convection 8 from the inner surface of the crucible 2 due to the chemical change between the melting liquid 1 and the crucible 2 on the inner surface of the crucible 2 where the melting liquid 1 of high temperature (e.g., approx. 1,500° C.) is contacted, and dispersed over the entire interior of the melting liquid 1. The impurities 9 become nuclei, a dislocation loop, defects, and/or grown fringes occur in the single crystal 7, and the quality of the single crystal 7 is deteriorated. Therefore, when a wafer of an LSI(-Large Scale Integration; large scale integrated circuit) is manufactured by such a single crystal 7, the wafer is impossible to use since the wafer including the defective part is accordingly deteriorated in the electric characteristics, and the yield of the wafer becomes wrong.

The diameter of the single crystal 7 will be remarkably increased in the future, but the larger the diameter of the crucible 2 increases, the larger the Grashof number increases, and the more the thermal convection 8 of the melting liquid 1 becomes vigorous, as understood from the above-described equation of the Grashof number. Thus, the quality of the single crystal 7 is directed toward deterioration. To this end, a method of applying a D.C. magnetic field to the melting liquid 1 so as to suppress the thermal convection 8 and pull a single crystal under the growing conditions near the thermal and chemical equilibrium state has been proposed.

FIG. 2A shows an example of a conventional single crystal manufacturing apparatus using a method of applying a magnetic field. In FIG. 2A, the same reference numerals as in FIG. 1 denote the same parts in FIG. 2A, and the description thereof will be omitted. In FIG. 2A, a magnet 10 which is composed of a copper coil for applying a uniform magnetic field in a direction designated by 11 being perpendicular to the pulling direction of a single crystal in a melting liquid 1 is disposed on the outer periphery of a crucible 2.

The melting liquid 1 of the single crystal 7 is in general a conductor having an electrical conductivity μ. Thus, when a fluid having the electrical conductivity is moved due to the thermal convection 8, the fluid moved in a direction not parallel to the direction 11 of applying a magnetic field is affected by the influence of a magnetic reluctance force by means of Lenz's law. Therefore, the motion of the thermal convection 8 is prevented.

Generally, the magnetic reluctance force when a magnetic field is applied, i.e., magnetic viscosity coefficient $\nu_{eff}$, is:

$$\nu_{eff} = (\mu HD)^2 \sigma / \rho$$

where
- μ: magnetic permeability of the melting liquid
- H: intensity of the magnetic field
- D: diameter of the crucible
- σ: electrical conductivity of the melting liquid
- ρ: density of the melting liquid When the intensity of the magnetic field increases, the magnetic viscosity coefficient $\nu_{eff}$ increases, and the ν in the equation of the above-described Grashof number increases. Thus, the Grashof number abruptly decreases, and the Grashof number can be reduced to be smaller than the critical value due to a certain intensity of the magnetic field. In this manner, the thermal convection of the melting liquid 1 can be completely suppressed.

Since the thermal convection can be suppressed by applying the magnetic field as described above, the aforementioned impurities in the single crystal 7, the dislocation loop, the defects and the grown fringes can be eliminated, and the single crystal 7 having uniform quality in the pulling direction of the single crystal can be obtained, thereby improving the quality and yield of the single crystal 7.

However, the conventional single crystal pulling apparatus having a normal conductive electromagnet composed of a copper coil as shown in FIG. 2A has the following drawbacks. In a large-sized single crystal pulling apparatus used for growing a single crystal having four inches or longer of the size, a housing 12 for containing a crucible 2 and a heater 3 becomes large with, for example, 900 mm or larger of a diameter. When a predetermined intensity $B_1$ of magnetic field (e.g., 2,000 gausses or higher) is intended to be produced in a solid-liquid surface boundary layer 6 by a magnet 10 mounted on the outer periphery of the housing 12 so as to suppress the thermal convection of the melting liquid 1, a very large coil for producing a large ampere-turn is necessary from the result of a calculation by Biot-Savart's law. For example, $10^6$ amperes-turn or higher is necessary.

In order to obtain such a large ampere-turn by the normal conductive electromagnet, the diameter of the coil becomes very large, so that the inner diameter of the coil normally becomes sufficiently larger than the height of the crucible 2, with the result that the cucible 2 is entirely covered by the coil. Thus, the distribution 13 of the magnetic field in the crucible 2 becomes substantially uniform with respect to the height direction of the crucible 2 as shown in FIG. 2B. Thus, the relationship between the intensity $B_1$ of the magnetic field in the solid-liquid surface boundary 6 and the intensity $B_2$ of the magnetic field in the lower portion of the crucible 2 normally becomes $|B_1 - B_2/B_1| < 5\%$.

Therefore, the Grashof number distribution of the melting liquid corresponding to the distribution 13 of the magnetic field becomes as designated by a curve 14, and all become equal to or lower than the critical Grashof number $N_{Gc}$, where $N_{G1}$ and $N_{G2}$ represent the Grashof numbers of the melting liquids in the solid-liquid surface boundary layer 6 and the bottom of the crucible 2. Consequently, the thermal convection of the melting liquid 1 in the crucible 2 is suppressed anywhere, and the melting liquid 1 becomes completely steady. In this state, the transfer path of the heat due to the transfer of the thermal convection is eliminated, and the supply of the heat from the heater 3 to the melting liquid 1 is only by the thermal conduction of the melting liquid.

When the size of the single crystal is small such as 2 to 3 inches, the crucible 2 becomes small such as 4 to 6 inches. Even when the melting liquid 1 is completely steady due to the application of the magnetic field, the heat supplied from the heater 3 is sufficiently transferred to the solid-liquid boundary layer 6 due to the thermal conduction of the melting liquid 1, with the result that there is almost no temperature difference between the solid-liquid surface boundary layer 6 and the periphery of the crucible 2. More particularly, the temperature difference is normally suppressed to ten and several degrees in Centigrade or less.

On the other hand, in the large-sized single crystal pulling apparatus having four inches or larger of the single crystal size, the diameter of the crucible 2 increases to 10 to 14 inches. Thus, the heat of the heater 3 is not sufficiently transferred to the solid-liquid surface boundary layer 6 disposed at the center of the crucible 2 only by the thermal conduction. Therefore, a large temperature difference occurs between the solid-liquid surface boundary layer 6 and the periphery of the crucible 2. More specifically, the difference normally becomes several tens of degrees in Centigrade.

In order to effectively grow the single crystal 7 in the solid-liquid surface boundary layer 6, a sufficient temperature higher than a predetermined value is required. For example, in case of a silicon single crystal, 1,400° C. or higher is required. Therefore, it is necessary to increase the power of the heater and to apply the temperature of the predetermined value to the solid-liquid surface boundary layer 6 by overcoming the temperature gradient thereof.

Further, when the temperature gradient is large, a considerable temperature gradient occurs even in the solid-liquid surface boundary layer 6 as the size of the single crystal is large. In order to grow a uniform single crystal 7, the temperature uniformity in the growing range is also required. Consequently, it is not preferable in the growth of the single crystal that there is such a large temperature gradient. When the temperature difference between the center of the crucible 2 and the periphery thereof is excessively large, the thermal stress acting on the crucible 2 becomes excessive, with the result that the crucible 2 is readily cracked.

SUMMARY OF THE INVENTION

The present invention has been made in consideration of this and has for its object to provide a single crystal manufacturing apparatus capable of growing a uniform single crystal and preventing a crucible from being cracked due to thermal stress.

According to an aspect of the invention, there is provided a single crystal manufacturing apparatus which comprises a crucible containing a melting liquid of a single crystal raw material; heating means arranged outside the crucible for heating the melting liquid; a pulling mechanism having a seed crystal movably supported substantially along a perpendicular direction to the surface of the melting liquid for growing a single crystal by inserting the seed crystal into the melting liquid and then pulling the seed crystal from the melting liquid; and magnetic field generating means having a superconductive magnet for applying to the melting liquid a magnetic field for suppressing a thermal convection in the vicinity of the surface of the melting liquid and allowing the thermal convection in the lower region of the melting liquid below the surface thereof.

According to the above-described single crystal manufacturing apparatus, the thermal convection is suppressed by the magnetic field in the vicinity of the surface of the melting liquid, i.e., in the vicinity of the solid-liquid surface boundary layer, thereby satisfying the growing conditions near the thermal and chemical equilibrium state. Simultaneously, the melting liquid is preferably agitated and equalized in quality in the range lower than the solid-liquid surface boundary layer in the melting liquid, and the temperature is uniformly maintained. Therefore, the thermal conductive effect to the solid-liquid surface boundary layer is enhanced, and the temperature difference between the periphery of the crucible and the solid-liquid surface boundary layer can be reduced. In addition, since the melting liquid thus sufficiently agitated is supplied to the solid-liquid surface boundary layer, a uniform single crystal is grown. Further, since the temperature difference between the center of the crucible and the periphery thereof becomes small, the crack of the crucible due to the thermal stress can be avoided.

BRIEF DESCRIPTION OF THE DRAWINGS

FIGS. 3A to 4 show a single crystal manufacturing apparatus in accordance with a first embodiment of the present invention;

FIG. 3A is a sectional view of the manufacturing apparatus;

FIGS. 3B and 3C are respectively characteristic diagrams showing the variations in the intensity of the magnetic field in the single crystal raw material melting liquid and the variations in the Grashof number;

FIG. 4 is a plan view of the manufacturing apparatus;

FIG. 6A is a sectional view of the manufacturing apparatus;

FIGS. 6B and 6C are characteristic diagrams respectively showing the variations in the intensity of the magnetic field in the melting liquid of the single crystal raw material and the variations in the Grashof number;

FIG. 7A is a sectional view of the manufacturing apparatus;

FIGS. 7B and 7C are characteristic diagrams respectively showing the variations in the intensity of the magnetic field in the melting liquid of the single crystal raw material and the variations in the Grashof number;

DETAILED DESCRIPTION OF THE PREFERRED EMBODIMENTS

Embobiments of the present invention will now be described in more detail with reference to the accompanying drawings.

Figure 1:
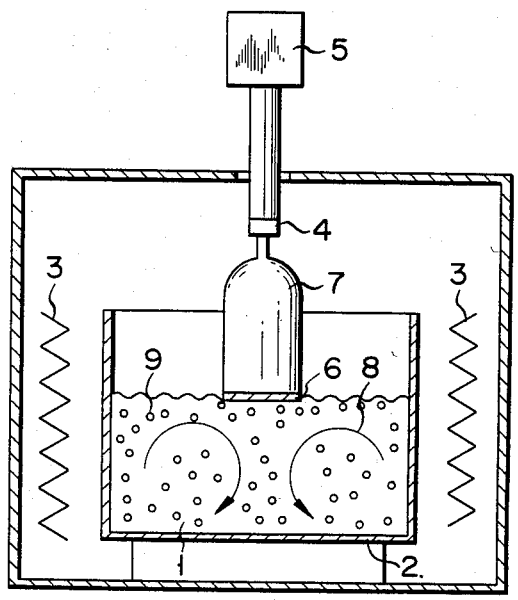
FIG. 1 is a sectional view schematically showing an example of a conventional single crystal manufacturing apparatus.
Figure 2A:
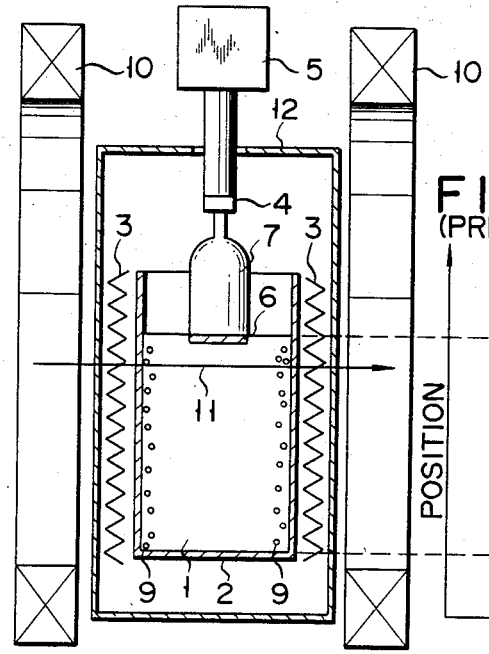
FIG. 2A is a sectional view schematically showing an example of a conventional single crystal manufacturing apparatus having a magnet.
Figures 2B, 2C:
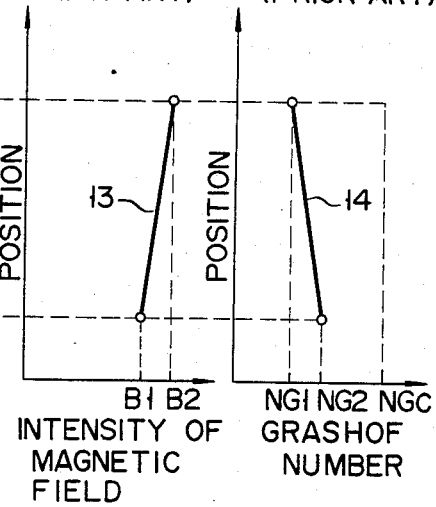
FIGS. 2B and 2C are characteristic diagrams respectively showing the intensity of the magnetic field acted on the single crystal raw material melting liquid in the apparatus in FIG. 2A and the variations in the Grashof number.
Figure 4:
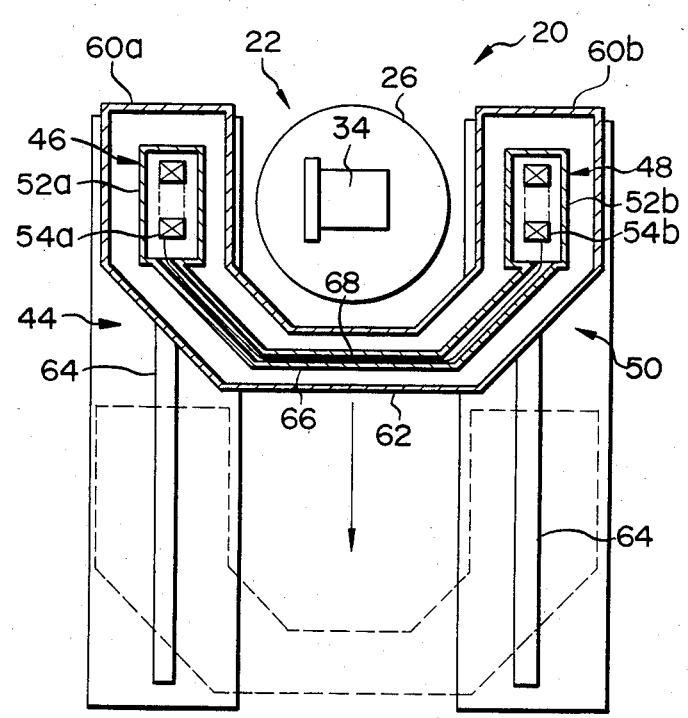

FIGS. 3A and 4 show a single crystal manufacturing apparatus 20 according to a first embodiment of the present invention. The manufacturing apparatus 20 comprises a single crystal pulling mechanism 22. The pulling mechanism 22 has a cylindrical housing 26 placed on a ground, and a crucible 30 of a substantially cylindrical shape for containing a melting liquid 28 of a single crystal raw material is coaxially arranged in the housing 26. A heater 32 for always holding a single crystal raw material in a melted state by heating the melting liquid 28 in the crucible is disposed in the housing 26 outside the crucible 30. A drive unit 34 is mounted on the upper surface of the housing 26, and a pulling shaft 36 is extended into the housing perpendicularly to the surface of the melting liquid through the upper surface of the housing from the drive unit. A seed crystal 38 is fixedly secured to the lower end of the pulling shaft 36. When the seed crystal is pulled from the melting liquid 28 at a predetermined constant speed after the pulling shaft 36 is driven by the drive unit 34 to insert the seed crystal 38 into the melting liquid 28, the crystal is grown at a solid-liquid surface boundary layer 49, i.e., the surface of the melting liquid, and a single crystal 42 is grown.

The single crystal manufacturing apparatus 20 also comprises a magnetic field generating unit 44 disposed outside the housing 26 for applying a magnetic field to the melting liquid 28. This unit 44 has first and second superconductive magnets 46, 48 and a support body 50 for supporting the magnets. These magnets 46, 48 respectively have insulated vessels 52a, 52b in which cryogenic (e.g., 4.2° K) liquid helium is filled, and superconductive coils 54a, 54b held in the vessels and maintained in a superconductive state. The first and second magnets 46, 48 are oppositely arranged at both sides of the housing 26. The superconductive coils 54a, 54b are coaxially arranged with each other, and so arranged that the central axes thereof are perpendicularly crossed to the central axis of the crucible 30 and coincident on the extension surface of the solid-liquid surface boundary layer 6. When the coils 54a, 54b are energized by disposing the coils 54a, 54b as described above, a magnetic field in a direction perpendicular to the pulling shaft 38 is applied to the melting liquid 28. The distance $L_2$ between the coils 54a and 54b is determined as $L_2 = L_1 + 2t + T$, where $L_1$ represents the diameter of the housing 26, T represents the width of the insulated vessels 52a, 52b and t represents the gap between the insulated vessels and the housing. The inner diameters $R_1$, the width D and the ampere-turn of the coils 54a, 54b arranged at the distance $L_2$ are selected so that the distribution of the magnetic field applied to the melting liquid 28 becomes as shown by a curve 56 in FIG. 3B.

More specifically, an intensity of a magnetic field at the position in depth H $(h > \delta)$ from the surface of the liquid to the thickness $\delta$ of the solid-liquid surface boundary layer 40 is set to an intensity $B_3$ of a magnetic field corresponding to the critical Grashof number $N_{Gc}$ so that the Grashof number of the melting liquid 28 at the position becomes the critical Grashof number $N_{Gc}$ as shown in FIG. 3C. Thus, the distribution of the magnetic field in the height of the crucible 30 becomes as shown by a curve 56 in FIG. 3B, and the distribution of the Grashof number corresponding thereto becomes as shown by a curve 58 in FIG. 3C.

In this case, $B_4$ represents the intensity of the magnetic field in the solid-liquid surface boundary layer 40, and has a relationship of $B_4 > B_3$, $B_5$ represents the intensity of the magnetic field in the bottom of the crucible 30, and has a relationship of $B_5 < B_3$, the $N_{G4}$ represents the Grashof number corresponding to the $B_4$, and has a relationship of $N_{G4} < N_{Gc}$, and $N_{G5}$ represents the Grashof number corresponding to the $B_5$, and has a relationship of $N_{G5} > N_{Gc}$.

The support body 50 has a first support portion 60a for containing and supporting the first superconductive magnet 46, a second support portion 60b for containing and supporting the second superconductive magnet 48, and a connecting portion 62 for connecting the support portions 60a, 60b to each other, and is formed substantially in a U-shape. A connecting tube 66 communicating with the insulated vessels 52a, 52b is arranged in the connecting portion 62, and liquid helium is filled in the tube 66. Further, a superconductive conductor 68 is extended as a power lead for connecting the superconductive coils 54a, 54b in series in the tube 66. The coils 54a, 54b are connected to a power source through power leads (not shown). The first and second support portion 60a, 60b are respectively mounted on a pair of parallel floor laid rails 64 disposed on the ground at both sides of the housing 26. Thus, the support body 50 is movable along the rails 64 between a first position designated by a solid line in FIG. 4, in which the housing 26 is surrounded by the first and second support portions 60a, 60b and the connecting portion 62, and a second position designated by a broken line in FIG. 4, in which the support body is sufficiently separated from the housing.

Then, an operation of the single crystal manufacturing apparatus 20 thus constructed as described above will now be described.

When the superconductive coils 54a, 54b are energized to apply a magnetic field to the melting liquid 28, the intensity of the magnetic field becomes larger than the $B_3$ in the portion from the solid-liquid surface boundary layer 6 to the depth H in the melting liquid, and the Grashof number $N_G$ becomes $N_G < N_{Gc}$. Thus, the thermal convection of the melting liquid 28 in the above portion is suppressed, and the melting liquid becomes steady. Therefore, the vicinity of the solid-liquid surface boundary layer 40 satisfies the single crystal growing conditions near the thermal and chemical equilibrium state.

The intensity of the magnetic field of the melting liquid 28 in the portion from the depth H to the bottom of the crucible 30 becomes smaller than the $B_3$, and the Grashof number $N_G$ of the melting liquid becomes $N_G > N_{Gc}$. Thus, the thermal convention in the melting liquid 28 still exists. Therefore, the heat from the heater 32 is effectively transferred to the center of the crucible 30 in this portion due to the transfer of the convection heat by the thermal convection 8. Consequently, the melting liquid 28 becomes substantially uniform in the temperature distribution therein. On the other hand, no convection heat transfer is presented in the portion from the solid-liquid surface boundary layer 6 to the depth H. However, the heat from the heater 32 is transferred to the solid-liquid surface boundary layer 40 by the thermal conduction from the periphery of the crucible 30 and from the uniform temperature melting part lower that the depth H. Therefore, since the heat transfer effect to the solid-liquid surface boundary layer 40 can be enhanced as compared with the conventional type, the temperature difference between the periphery of the crucible 30 and the solid-liquid surface boundary layer 40 can be reduced. Consequently, the crack of the crucible 30 due to the thermal stress can be avoided. Further, since the melting liquid 28 is preferably agitated by the thermal convection to the part directly under the solid-liquid surface boundary layer 40 in which the single crystal 42 is grown, the melting liquid 1 is supplied as the uniform raw material to the growing portion. As a result, a uniform single crystal can be grown.

It is in general necessary in a single crystal manufacturing apparatus that the inner surfaces of the crucible 30 and the housing 26 should be cleaned whenever the pulling operation of the single crystal is completed. This cleaning is carried out in the state that the superconductive magnets are separated from the housing. However, in the conventional single crystal manufacturing apparatus, the superconductive magnets are not readily separated from the housing, and the above-described cleaning work becomes complicated.

On the other hand, according to the embodiment of the present invention, the superconductive magnets 46, 48 are supported by the support body 50 formed in a U-shape, and are movable between the first position and the second position along the rails. Therefore, the superconductive magnets 46, 48 can be readily separated from the housing by moving the support body 50 to the second position when the crucible 30 and the housing are cleaned, and the cleaning work can be facilitated.

Further, since the superconductive conductor 68 dipped in liquid helium is used as a crossover cable between the superconductive coils 54a and 54b, the introduction of the heat from the normal temperature portion to the insulated vessels 52a, 52b can be largely reduced. As a result, the quantity of evaporated liquid helium can be reduced in the vessels 52a, 52b, and the superconductive coils 54a, 54b can be readily held in the superconductive state.

Figure 5:
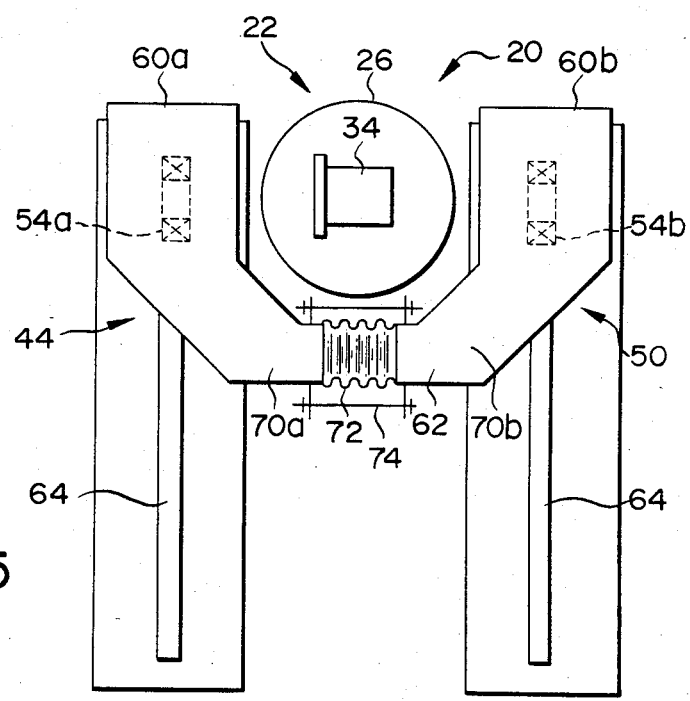
FIG. 5 is a plan view showing a modification of a supporting base.

In the first embodiment described above, the support body 50 may be formed as shown in FIG. 5. In other words, in the modification, the connection portion 62 is divided into a first section 70a fixed to the first support portion 60a and a second section 70b fixed to the second support portion 60b, and these sections are connected to each other by a flexible joint 72 and fastening means 74 for adjusting the length of the flexible joint 72.

According to the support body 50 thus constructed, the interval between the support portions 60a and 60b, i.e., the interval between the superconductive magnets 46, 48 can be varied by adjusting the length of the joint 72. Therefore, the length of the flexible joint 72 can be adjusted to the size of the outer diameter of the housing 26 of the single crystal pulling mechanism 22, and the length of the joint can be fixed by the fastening means 74. Consequently, the single magnetic field forming unit 44 can be adapted for crystal pulling mechanisms of all types already installed and newly mounted.

Figure 6:
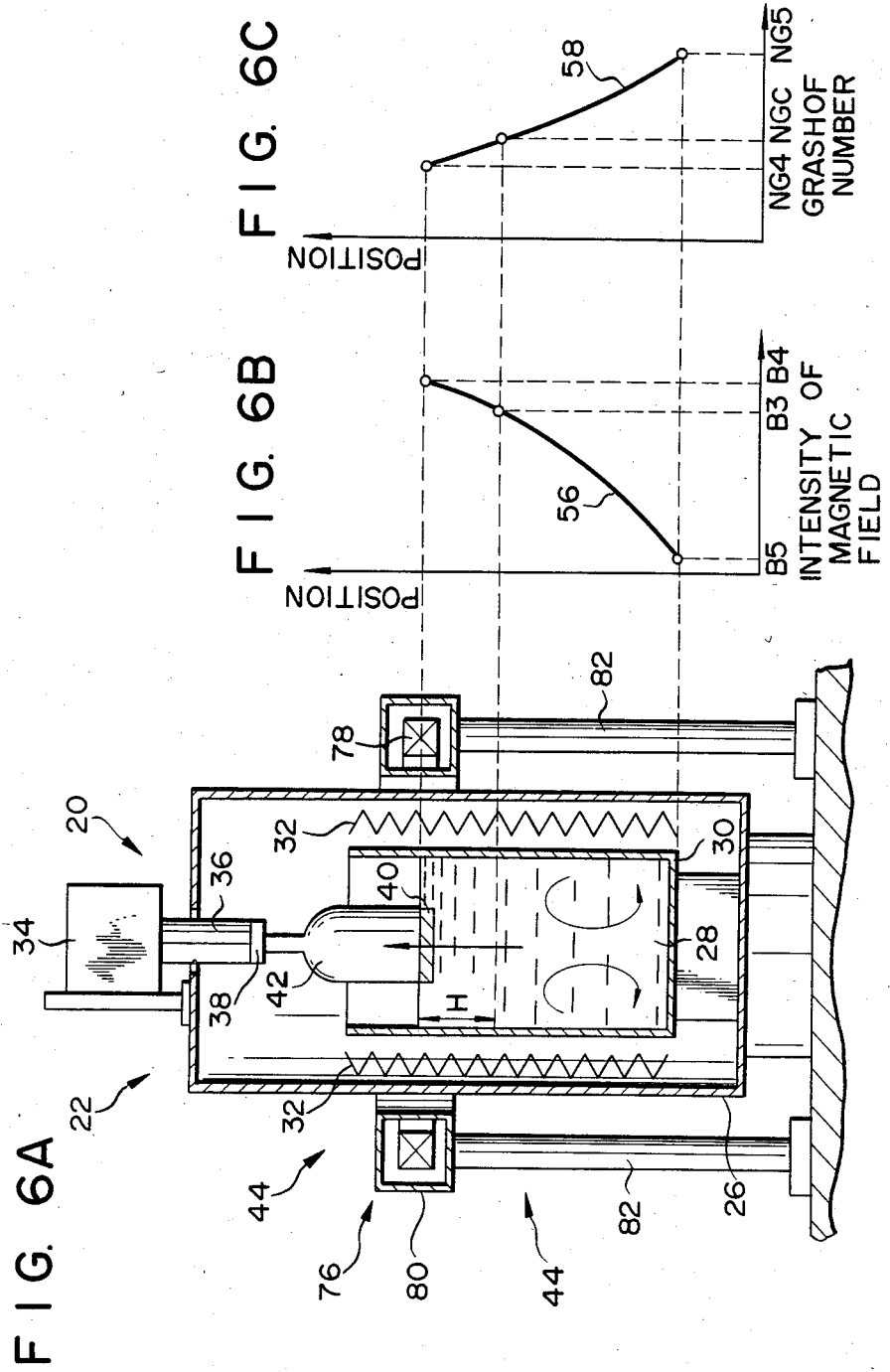
FIGS. 6A to 6C respectively show a single crystal manufacturing apparatus according to a second embodiment of the present invention.

A second embodiment of the present invention will now be described with reference to FIGS. 6A to 6C. In FIG. 6A, the same reference numerals as in the first embodiment denote the same parts in the second embodiment, and the detailed description thereof will be omitted. According to this second embodiment, the magnetic field generating unit 44 has a single superconductive magnet 76 instead of the above-described first and second superconductive magnets. The superconductive magnet 76 has a superconductive coil 78 and an annular insulated vessel 80 for containing the coil 78, and supported by a plurality of supporting legs 82 to the outside of the housing 26. The coil 78 is coaxially provided with the crucible 30, and disposed in the same plane as the solid-liquid surface boundary layer 40 of the melting liquid 28. Thus, the superconductive magnet 76 applies a magnetic field along the axial direction of the crucible 30 to the melting liquid 28. Then, the inner and outer diameters, the width and the ampereturn of the superconductive coil 78 are set so that the distribution of the intensity of the magnetic field to be applied to the melting liquid 28 by the superconductive magnet 76 becomes similar to that of the first embodiment as shown by a curve 56 in FIG. 6B, and the Grashof numbers in the respective positions in the melting liquid become as designated by a curve 58 in FIG. 6C.

Even in this second embodiment, the crack of the crucible can be prevented and the uniform single crystal can be manufactured in the same manner as the first embodiment described above.

Figure 7:
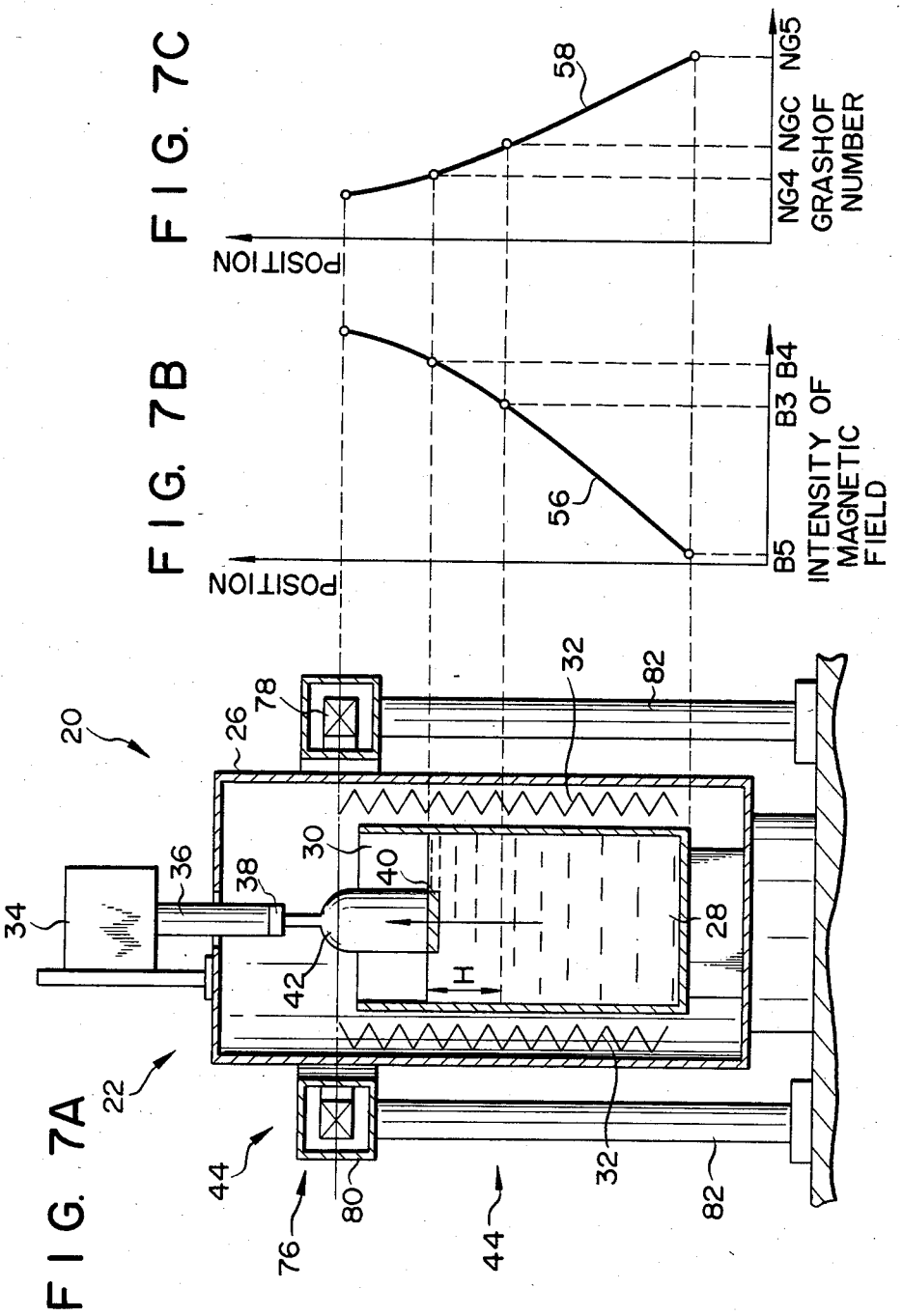
FIGS. 7A to 7C show a single crystal manufacturing apparatus according to a third embodiment of the present invention.

FIGS. 7A to 7C show a third embodiment of the present invention. This third embodiment is constructed similarly to the second embodiment except that a superconductive coil 78 is disposed coaxially with a crucible 30 and in an upper plane by a distance h from a solid-liquid surface boundary layer 40. When the superconductive coil 78 is energized, the distribution of the intensity of the magnetic field shown by a curve 56 in FIG. 7B and the Grashof number shown by a curve 58 in FIG. 7C can be obtained in the melting liquid 28 in the same manner as the first embodiment described above. The reason why the superconductive coil 78 is disposed above by the distance h from the surface of the melting liquid 28, as described above, is because there is a case where the distribution of the intensity of the magnetic field as shown in FIG. 3B cannot be obtained even by using the superconductive magnet due to the shape of the crucible such as the fact that the depth of the crucible 30 is, for example, shallow. In other word, there is a case where the distribution of the intensity of the magnetic field becomes such that the Grashof members in all range of the melting liquid are less than the critical Grashof number $N_{Gc}$. However, the desired magnetic field distribution can be obtained even in the above-described case by adjusting the position for arranging the superconductive coil as in the third embodiment.

Figure 8:
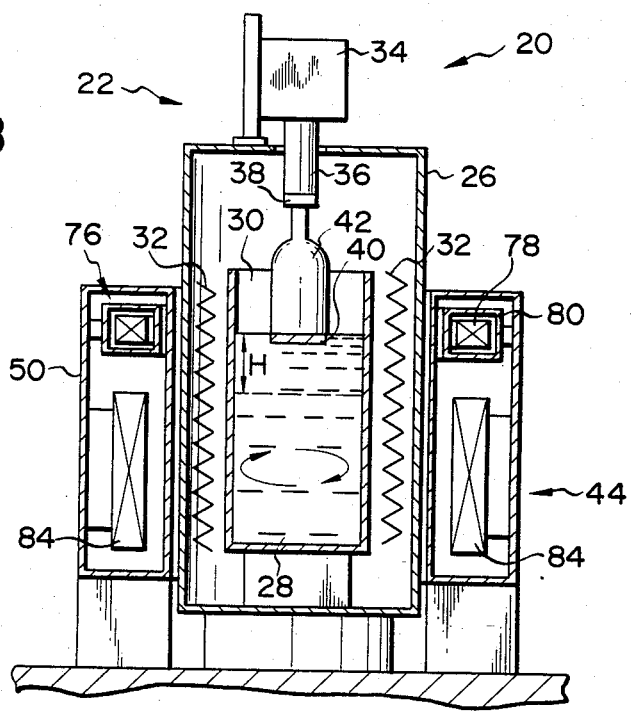
FIG. 8 is a sectional view of a single crystal manufacturing apparatus according to a fourth embodiment of the present invention.

According to a fourth embodiment of the present invention shown in FIG. 8, a magnetic field generating unit 44 has, in addition to a superconductive magnet 76 for suppressing the thermal convection of a melting liquid 28, a plurality of coils 84 for generating a rotary magnetic field in the lower range of the melting liquid 28 so as to increase the agitating effect of the melting liquid in the lower portion of a crucible 30. These coils 84 are formed, for example, by arranging three coils with a 3-phase alternating currents on the outer periphery of the housing 26 by displacing the coils at 120° with the axis of the crucible 30 as a center.

According to the fourth embodiment described above, the agitating effect of the melting liquid is increased, thereby further equalizing the quality of the melting liquid and the temperature of the melting liquid. The coils 84 may be any superconductive coil or normal conductive coil.

Figure 9:
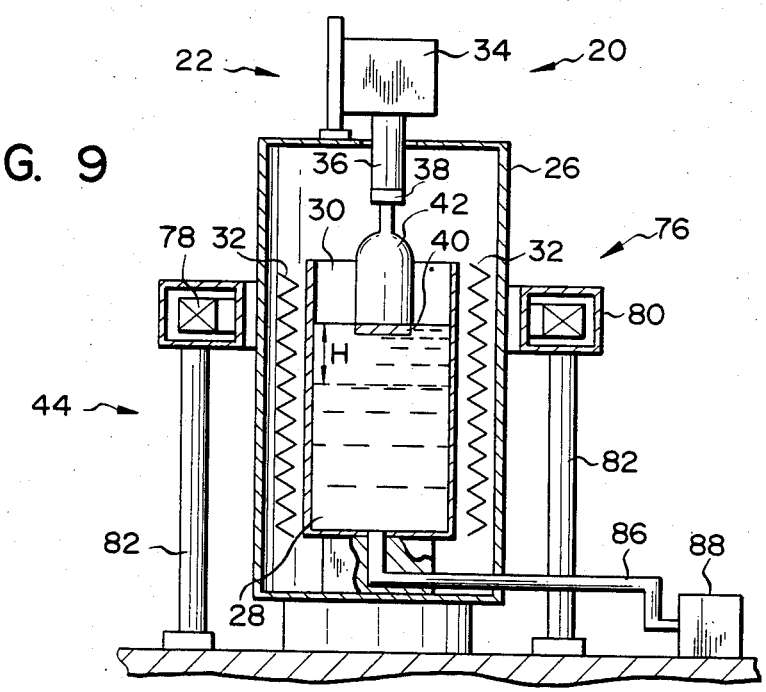
FIG. 9 is a sectional view of a single crystal manufacturing apparatus according to a fifth embodiment of the present invention.

Further, according to a fifth embodiment of the present invention shown in FIG. 9, in order to increase the agitating effect of a melting liquid 28 in the lower part of a crucible 30, an ultrasonic wave generator 87 is connected through a waveguide 86 to the lower end of the crucible. Thus, the thermal convection in the range in the vicinity of the solid-liquid surface boundary layer 40 of the melting liquid 28 is suppressed by the superconductive magnet 76, and the melting liquid in the lower part of the crucible 30 is agitated by the ultrasonic wave introduced by the generator 88 through the waveguide 86 into the crucible. Therefore, even in this fifth embodiment, the operations and the advantages similar to those of the fourth embodiment can be provided.

The same reference numerals as in FIGS. 7A to 9 denote the same parts in FIGS. 4 to 6A.

The present invention is not limited to the particular embodiments described above. Various other changes and modifications may be made within the spirits and scope of the present invention.

What is claimed is:

1. A single crystal manufacturing apparatus comprising:
   a crucible containing a melting liquid of a single crystal raw material;
   heating means arranged outside the crucible for heating the melting liquid;
   a pulling mechanism having a seed crystal movably supported substantially along a perpendicular direction to the surface of the melting liquid for growing a single crystal by inserting the seed crystal into the melting liquid and then pulling the seed crystal from the melting liquid; and
   magnetic field generating means having a superconductive magnet for applying to the melting liquid a magnetic field for suppressing a thermal convection in the vicinity of the surface of the melting liquid and allowing the thermal convection in the region of the melting liquid below the surface thereof.

2. The single crystal manufacturing apparatus according to claim 1, wherein said magnetic field generating means includes first and second superconductive magnets arranged opposite to each other with the crucible interposed therebetween, and the superconductive magnets applying a magnetic field parallel to the surface of the melting liquid to the melting liquid.

3. The single crystal manufacturing apparatus according to claim 2, wherein each of said first and second superconductive magnets includes a superconductive coil and an insulating vessel for containing the coil, and the superconductive coils are arranged coaxially with each other and the central axes thereof are arranged to coincide with the surface of the melting liquid.

4. The single crystal manufacturing apparatus according to claim 2, wherein said magnetic field generating means includes a support body supporting the first and second superconductive magnets and being arranged to be movable toward and away from the crucible.

5. The single crystal manufacturing apparatus according to claim 4, wherein said support body has a first support portion for supporting the first superconductive magnet, a second support portion for supporting the second superconductive magnet, and a connecting portion for connecting the first and second support portions to each other, and said first and second support portions being arranged to be movable along a direction parallel to the surface of the melting liquid.

6. The single crystal manufacturing apparatus according to claim 5, wherein said connecting portion is divided into a first section connected to the first support portion and a second section connected to the second support portion, the support body includes shrinkable joint means for connecting the first and second sections, thereby providing the first and second support portions to be movable toward and away from each other.

7. The single crystal manufacturing apparatus according to claim 6, wherein said support body includes fastening means for defining the shrinkage of the joint means to fix an interval between the first and second sections.

8. The single crystal manufacturing apparatus according to claim 1, wherein said superconductive magnet includes a superconductive coil and an insulated vessel for containing the coil, and the superconductive coil is arranged so that the central axis thereof is perpendicular to the surface of the melting liquid, and applies a magnetic field to the melting liquid in a direction perpendicular to the surface of the melting liquid.

9. The single crystal manufacturing apparatus according to claim 8, wherein said superconductive coil is arranged in the same plane as the surface of the melting liquid.

10. The single crystal manufacturing apparatus according to claim 1, wherein said magnetic field generating means includes a magnet for applying a rotary magnetic field to the melting liquid for agitating the region of the melting liquid below the surface thereof.

11. The single crystal manufacturing apparatus according to claim 1, which further comprises ultrasonic wave generating means for applying a supersonic wave to the melting liquid for agitating the region in the melting liquid below the surface thereof.

* * * * *